United States Patent [19]

Fujita et al.

[11] Patent Number: 5,251,100
[45] Date of Patent: Oct. 5, 1993

[54] SEMICONDUCTOR INTEGRATED CIRCUIT DEVICE WITH COOLING SYSTEM AND MANUFACTURING METHOD THEREFOR

[75] Inventors: Yuuji Fujita, Koganei; Masahide Tokuda, Ome, both of Japan

[73] Assignee: Hitachi, Ltd., Tokyo, Japan

[21] Appl. No.: 934,330

[22] Filed: Aug. 25, 1992

[30] Foreign Application Priority Data

Aug. 28, 1991 [JP] Japan ............................ 3-216793

[51] Int. Cl.⁵ .................................................. H05K 7/20
[52] U.S. Cl. ........................................ 361/719; 165/185;
 165/80.3; 165/80.4; 174/16.3; 257/706;
 257/713; 361/689; 361/699; 361/707
[58] Field of Search .................................. 257/705-707,
 257/712-713, 719-722, 726, 727; 165/185, 80.3,
 80.4; 176/16.3; 361/382-383, 385-389, 392, 394

[56] References Cited

U.S. PATENT DOCUMENTS

4,558,395 12/1985 Yamada et al. .................... 361/385

FOREIGN PATENT DOCUMENTS

59-50552 3/1984 Japan .
59-200495 11/1984 Japan .
63-73650 4/1988 Japan .
1-115148 5/1989 Japan .
0009597 1/1991 Japan .................................. 361/386

Primary Examiner—Gregory D. Thompson
Attorney, Agent, or Firm—Fay, Sharpe, Beall, Fagan, Minnich & McKee

[57] ABSTRACT

A semiconductor integrated circuit device is equipped with a cooling system which serves to cool a plurality of integrated circuit chips mounted on a circuit board. The cooling system is kept in contact with the upper surfaces of the plurality of integrated circuit chips. A chip surface arranging plate of uniform thickness is formed with apertures smaller than the integrated circuit chips mounted on the circuit board. The cooling system is fixed on the chip surface arranging plate. The upper surfaces of the integrated circuit chips are substantially kept flush by the chip surface arranging plate. Further, the integrated circuit chips are thermally joined to the cooling system so that heat generated by the integrated circuit chips is removed by the cooling system. The plurality of integrated circuit chips are joined to the chip surface arranging plate by applying a vacuum that causes suction of air through the apertures formed in the chip surface arranging plate. Thereafter, the cooling system is fixed to the chip surface arranging plate.

13 Claims, 6 Drawing Sheets

SEMICONDUCTOR INTEGRATED CIRCUIT DEVICE WITH COOLING SYSTEM AND MANUFACTURING METHOD THEREFOR

BACKGROUND OF THE INVENTION

The present invention relates to a semiconductor integrated circuit device having a plurality of integrated circuit chips mounted on a circuit board and, more particularly, to a semiconductor integrated circuit device which is equipped with a cooling system serving to remove heat generated by integrated circuit chips having high power dissipation.

In an electronic computer and the like, integrated circuit chips having high power dissipation are mounted on a circuit board at high density in order to perform the circuit operation at high speed. The power dissipation of these integrated circuit chips reaches thousands W (watts) on the circuit board so that, in order to assure the circuit operation, a powerful and compact cooling system becomes indispensable. Conventional techniques concerning the cooling of the semiconductor integrated circuit device having such integrated circuit chips mounted on the circuit board include the one disclosed in U.S. Pat. No. 4,558,395, for example. According to the technique disclosed in the U.S. Pat. No. 4,558,395, a cooling member is made to contact with each integrated circuit chip and coolant is supplied to the cooling member, thereby effecting the cooling. Flexible pipes are used as means for supplying coolant so as to absorb or compensate unevenness in height of the integrated circuit chips caused by the warp of the circuit board or the like, so that the integrated circuit chips and the cooling members are kept in good contact with each other. According to this cooling system, in case that water is used as the coolant, it is possible to remove the power dissipation of 100 W per 1 cm$^2$, for example.

However, in such cooling system, all the connections between a plurality of pipes and the cooling members must be so joined as to prevent leakage of the coolant. Further, the load caused by the elasticity of the pipe and the pressure of the coolant is applied to each integrated circuit chip, resulting in the possibility that the reliability of connecting terminals serving to connect the integrated circuit chips to the circuit board is deteriorated. In addition, if the pipes and the cooling members are made of metallic materials of different kinds respectively, the coolant comes in contact with the galvanic contacts to bring about the reduction of corrosive life.

To cope with such problem, there has been known a technique that integrated circuit chips are mounted on a rigid circuit board through flexible members and that the whole back (upper surface) of every integrated circuit chip is forced to bear against a cooling system having a surface of very high flatness by the pressing force applied from a side of the rigid circuit board. According to this technique, difference in gap between the respective integrated circuit chips and the cooling system is absorbed or compensated by the flexible members so that cooling of the integrated circuit chips can be effected by one cooling system with simple construction. Such technique is disclosed in Japanese Patent Unexamined Publication No. 59-50552(A), for example.

However, according to this cooling system, if the pressing force applied from the side of the circuit board is not adjusted sufficiently, it is impossible to stick all the integrated circuit chips to the cooling system with reliability. Namely, since the circuit board is a rigid body there is a possibility that all the integrated circuit chips cannot be forced to bear against the cooling system correctly due to the warp of the circuit board or the like. Further, the integrated circuit chips are applied with pressing load by the flexible members at all times. Particularly when lead wires are used as the flexible members, there is caused contact failure due to deformation of the lead wire, failure in the bearing of the chip against the cooling system due to deterioration of the flexibility of the lead wire and the like. Moreover, even in case of replacing the defective cooling system, every integrated circuit chip needs to be detached from and attached to as well as forced to bear against the cooling system, resulting in a heavy burden being placed on the engineer.

SUMMARY OF THE INVENTION

Accordingly, an object of the present invention is to provide a semiconductor integrated circuit device with cooling system which is excellent in reliability of connection and capable of efficiently cooling integrated circuit chips of high power consumption while solving the above-described problems of the prior art at least partly, and a manufacturing method therefor.

Further, another object of the present invention is to provide a semiconductor integrated circuit device with cooling system which is easy to assemble and replace, and a manufacturing method therefor.

For attaining the above-described objects, in accordance with an aspect of the present invention, a semiconductor integrated circuit device with cooling system is equipped with a cooling system, which serves to cool a plurality of integrated circuit chips mounted on a circuit board, with one plane surface thereof kept in contact with upper surfaces of the plurality of integrated circuit chips, a chip surface arranging plate which is formed with apertures the size of which is smaller than that of the integrated circuit chips is disposed on the upper surfaces of the plurality of integrated circuit chips mounted on the circuit board, and the cooling system is mounted to bear on the chip surface arranging plate. It is preferred that the plurality of integrated circuit chips are joined to the chip surface arranging plate by being absorbed respectively through the apertures formed in the chip surface arranging plate.

Further, in accordance with the present invention, it is preferred, in the semiconductor integrated circuit device with cooling system having the construction described above, that the apertures of the chip surface arranging plate are filled up with a heat conductor.

On the other hand, according to another aspect of the present invention, a method for manufacturing a semiconductor integrated circuit device with cooling system which is equipped with a cooling system, which serves to cool a plurality of integrated circuit chips mounted on a circuit board, with one plane surface thereof kept in contact with upper surfaces of the plurality of integrated circuit chips, comprises the steps of: putting a chip surface arranging plate which is uniform in thickness and formed in the positions thereof corresponding to the integrated circuit chips respectively with apertures the size of which is smaller than that of the integrated circuit chips, on upper surfaces of the plurality of integrated circuit chips mounted on the circuit board; joining the plurality of integrated circuit chips to the chip surface arranging plate by absorbing them through the apertures respectively; and mounting the cooling system to bear on the chip surface arranging plate.

Further, the plurality of integrated circuit chips are joined to the chip surface arranging plate by making use of an absorbing tool which serves to absorb the integrated circuit chips at a time through the apertures of the chip surface arranging plate, so that the plurality of integrated circuit chips are joined to the chip surface arranging plate nearly simultaneously.

In the present invention, the integrated circuit chips are made in substantially close contact with the cooling system through the chip surface arranging plate so that the distance between the cooling system and the integrated circuit chips is kept uniform. Namely, the integrated circuit chips on the circuit board are arranged to be flush beforehand by the chip surface arranging plate which is uniform in thickness, and then the cooling system is fixed to this chip surface arranging plate. By so doing, it is Possible to mount a cooling system to be contacted with all the integrated circuit chips simultaneously and easily.

Further, since the chip surface arranging plate and the integrated circuit chips are joined by making use of the absorbing force, it is possible to join all the integrated circuit chips to the chip surface arranging plate reliably without being affected by the warp of the circuit board, resulting in reliable conduction of heat between each of the integrated circuit chips and the cooling system.

In addition, since the absorbing force used in joining the chip surface arranging plate to the integrated circuit chips becomes unnecessary after the joining, the integrated circuit chips and the lead wires are freed from the load, thereby making it possible to avoid the damage to the integrated circuit chips and defective wiring.

In this way, it is possible to easily assemble the semiconductor integrated circuit device with cooling system which is excellent in reliability of connection and anti-corrosion property and which is capable of sufficiently cooling the integrated circuit chips of high power dissipation.

DESCRIPTION OF THE PREFERRED EMBODIMENTS

Figure 1:
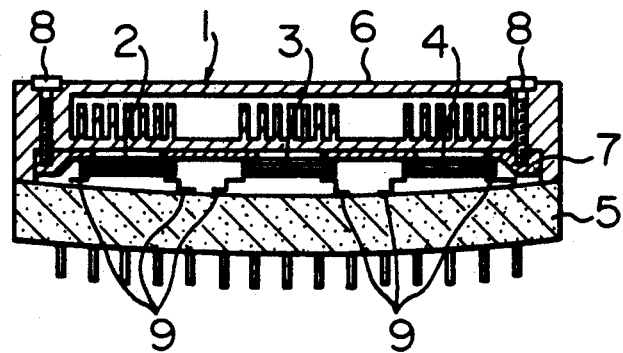
FIG. 1 is a side sectional view, for illustrating a construction, of a semiconductor integrated circuit device with cooling system according to an embodiment of the present invention.

FIG. 1 is a side sectional view, for illustrating the construction, of a semiconductor integrated circuit device with cooling system according to an embodiment of the present invention.

A semiconductor integrated circuit device with cooling system, 1, according to this embodiment comprises a semiconductor integrated circuit device in which a plurality of integrated circuit chips 2 to 4 having relatively high power consumption are mounted on a circuit board 5, a cooling system 6 serving to cool the integrated circuit chips 2-4 by coolant flowing through the inside of the cooling system, a chip surface arranging plate 7 assembled to keep uniform the distance between the cooling system 6 and the integrated circuit chips 2-4, screws 8 for fixing the chip surface arranging plate 7 and the cooling system 6 to each other, and lead wires 9 for electrically connecting the integrated circuit chips 2-4 to the circuit board 5.

The circuit board 5 of substantially rigid body has been deformed so that, properly speaking, an upper surface of the integrated circuit chip 3, that is, the surface thereof adjacent to the cooling system 6 is located lower as compared with corresponding surfaces of the other integrated circuit chips 2 and 4. However, in the present embodiment, the upper surface of the integrated circuit chip 3 is joined to the chip surface arranging plate 7 together with the integrated circuit chips 2 and 4 and, hence, the heights of the respective integrated circuit chips 2-4 on the circuit board 5 are made to be flush with each other in one plane of the chip surface arranging plate 7. The lead wires 9 have a rigidity that is so small as not to cause the load applied to the connecting portions between the lead wires 9 and the integrated circuit chips 2-4 and the connecting portions between the lead wires 9 and the circuit board 5 to deteriorate the reliability of the connecting portions even when the lead wires 9 are deformed at the step of joining the integrated circuit chips 2-4 to the chip surface arranging plate 7. In addition, the lead wires 9 have a length long enough for the connection between the integrated circuit chips 2-4 and the circuit board 5 even in case of making correction for the unevenness in height of the chips 2-4.

As described above, by joining all the integrated circuit chips 2-4 on the circuit board 5 to the chip surface arranging plate 7, the integrated circuit chips 2-4 and the cooling system 6 can be fixed to each other easily and reliably through the chip surface arranging plate 7 only by tightening the screws 8.

The chip surface arranging plate 7 is formed with apertures corresponding to the integrated circuit chips 2-4, each aperture being of smaller area than the area of the upper surface of the integrated circuit chips 2-4. In the process of manufacturing the semiconductor integrated circuit device 1, the integrated circuit chips 2-4 are absorbed through the apertures so as to be joined to the chip surface arranging plate 7 as described later. Further, by filling up the apertures with for example thermally conductive grease or the like after the integrated circuit chips 2-4 are joined to the chip surface arranging plate 7, it is possible to cool the integrated circuit chips 2-4 by the cooling system 6 more efficiently.

Description will be given below of the semiconductor integrated circuit device with cooling system, 1, in which the apertures of the chip surface arranging plate 7 are filled up with thermally conductive grease or the like.

Figure 2:
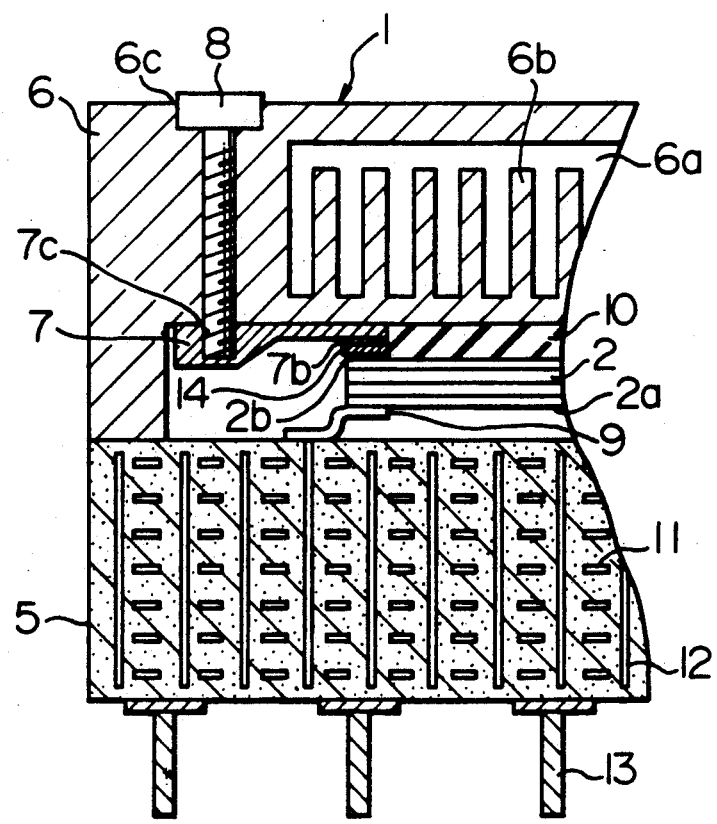
FIG. 2 is a side sectional view, for illustrating the detail of the construction, of the semiconductor integrated circuit device with cooling system shown in FIG. 1.

FIG. 2 is a side sectional view, for illustrating the detail of the construction, of the semiconductor integrated circuit device with cooling system shown in FIG. 1.

FIG. 2 shows, on an enlarged scale, a part of the semiconductor integrated circuit device with cooling system, 1, shown in FIG. 1, in which the integrated circuit chip 2 is provided. The integrated circuit chip 2 mounted on the circuit board 5 and the chip surface arranging plate 7 are joined to each other at a metallized portion 2b prepared on the upper surface of the integrated circuit chip 2 and a metallized portion 7b prepared on the chip surface arranging plate 7 by means of a bonding agent 14 such as solder. These metallized portions 2b, 7b and the bonding agent 14 such as solder are so provided as to surround the four sides, i.e. whole periphery, of each aperture of the chip surface arranging plate 7. The apertures of the chip surface arranging plate 7 fixed to the cooling system 6 by means of the screws 8 are filled up with thermally conductive compound 10. Since the peripheral portion around the aperture of the chip surface arranging plate 7 is joined by means of the bonding agent 14, there is no possibility that the thermally conductive compound 10 leaks out onto the circuit board 5 and the lead wires 9. Incidentally, the screws 8 are passed through tapped holes 6c of the cooling system 6 and tightened in tapped holes 7c of the chip surface arranging plate 7.

Inside the cooling system 6 are provided fins 6b through which heat is transferred to the coolant flowing through the flow passage 6a.

Further, the lead wires 9 serving to transmit signals to and from the circuit formed in the integrated circuit chip 2 are provided on the lower surface 2a of the integrated circuit chip 2 adjacent to the circuit board 5. The lead wires 9 are soldered to terminals formed on the upper surface of the circuit board 5. The melting point of the solder used to connect the lead wires 9 to the circuit board 5 is higher than that of the bonding agent 14 used to join the integrated circuit chip 2 to the chip surface arranging plate 7. The circuit board 5 is made of AlN or $Al_2O_3$, and multi-layer wirings 11 and through holes 12 are formed inside thereof. Input-output pins 13 are provided on the lower surface of the circuit board 5 so that input/output terminals of the integrated circuit chip 2 are electrically connected to the input-output pins 13 via the lead wires 9, the multi-layer wirings 11 and the through holes 12.

In the semiconductor integrated circuit device with cooling system, 1, having such construction, heat generated by the integrated circuit chip 2 conducts through the thermally conductive compound 10 to the cooling system 6 so as to be removed to the outside by the coolant flowing through the flow passage 6a. Heat transfer efficiency is decided by the thickness and thermal conductivity of each heat pass constituting member, the efficiency of the heat transfer of the fin 6b and the heat transport capacity of the coolant. Here, it is assumed, as an example, that the thermally conductive compound 10 has a thermal conductivity of about 1.30 W/m·K and a thickness of about 40 μm. Further, the cooling system 6 is made of SiC which exhibits a high thermal conductivity (of 270 W/m·K). Moreover, the height, pitch and spacing of the fins 6b are chosen to be 2 mm, 0.4 mm and 0.2 mm, respectively. The coolant is water which flows between the fins at a flow rate of about 1 m/sec.

Under these conditions, as a result of evaluating the heat transfer efficiency, the thermal resistance between each integrated circuit chip and the coolant is 0.5° C./W per 1 $cm^2$. If the temperature of the integrated circuit chip is permitted to rise up to 50° C., in the semiconductor integrated circuit device with cooling system, 1, it becomes possible to remove the heat of 100 W per 1 $cm^2$.

Figure 3A:
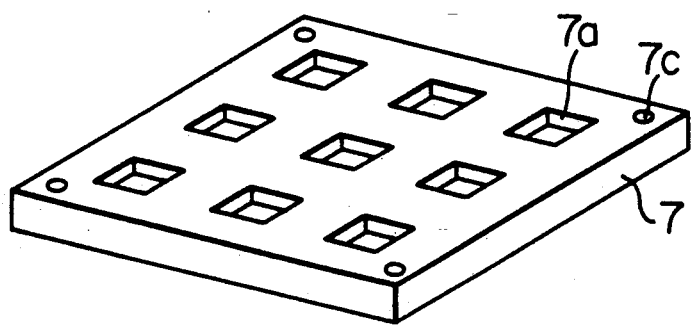
FIG. 3A is a perspective view of an example of a chip surface arranging plate as viewed from above.
Figure 3B:
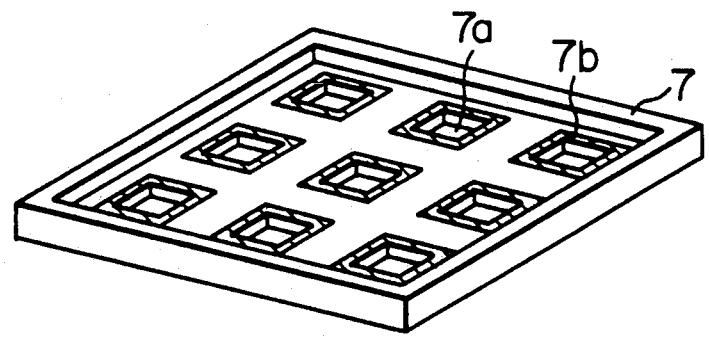
FIG. 3B is a perspective view of the example of the chip surface arranging plate as viewed from below.

FIGS. 3A and 3B are perspective views for illustrating an example of structure of the chip surface arranging plate disposed in the semiconductor integrated circuit device with cooling system shown in FIG. 1. More specifically, FIG. 3A is a perspective view of the chip surface arranging plate 7 of FIG. 1 as viewed from the upper side thereof, while FIG. 3B is a perspective view of the chip surface arranging plate 7 as viewed from the lower side thereof.

The chip surface arranging plate 7 is made of for example "kovar (trademark)" and formed with square apertures 7a corresponding to the positions in which the integrated circuit chips 2-4 are to be mounted as shown in FIG. 3A. Further, the chip surface arranging plate 7 is formed in the four corners thereof with the tapped holes 7c used for fixing to the cooling system 6. As shown by hatching in FIG. 3B, the peripheral edge portion of each aperture 7a is formed with the metallized portion 7b by means of Au plating or the like.

The chip surface arranging plate 7 having such structure is joined to the upper surfaces of the integrated circuit chips 2-4 as shown in FIG. 2. Namely, the metallized portion 2b formed on the peripheral edge portion of the integrated circuit chip 2 and the metallized portion 7b of the chip surface arranging plate 7 are joined with each other by the bonding agent 14 such as solder. Further, the aperture 7a enclosed by the integrated circuit chip 2 and the cooling system 6 is filled up with the thermally conductive compound 10. And by screwing the screws 8 into the tapped holes 7c, 6c formed in the chip surface arranging plate 7 and the cooling system 6, respectively, the cooling system 6 and the chip surface arranging plate 7 are mechanically fixed to each other, and hence, the integrated circuit chips 2-4 and the cooling system 6 are closely contacted with each other insuring good heat transfer with each other.

Next, description will be given below of the method for manufacturing the semiconductor integrated circuit device with cooling system which is equipped with the chip surface arranging plate 7 described above by referring to FIGS. 4-9.

Figure 4:
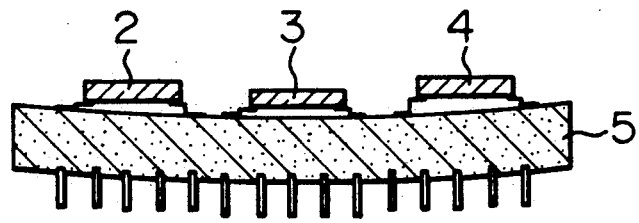
FIG. 4 is a side sectional view, for illustrating a state, of the semiconductor integrated circuit device at one of steps of the manufacturing process of the semiconductor integrated circuit device shown in FIG. 1.

As shown in FIG. 4, in the first plate, a plurality of integrated circuit chips 2-4 are mounted on the circuit board 5. The circuit board 5 and the integrated circuit chips 2-4 are electrically connected by means of the lead wires 9 made of a flexible wire member of small rigidity and having a length long enough to maintain the electrical connection between each of the integrated circuit chips 2-4 and the circuit board 5 even when the integrated circuit chips 2-4 are absorbed as described later.

Figure 5:
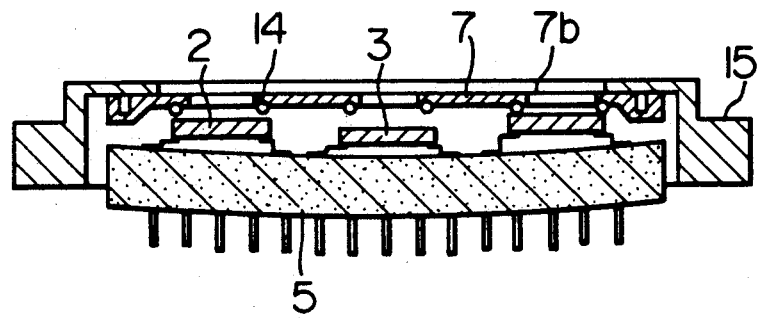
FIG. 5 is a side sectional view for illustrating a state of the semiconductor integrated circuit device prior to a step of assembling the chip surface arranging plate in the manufacturing process of the semiconductor integrated circuit device shown in FIG. 1.

Subsequently, as shown in FIG. 5, the chip surface arranging plate 7 is set on the semiconductor integrated circuit device shown in FIG. 4 which comprises the circuit board 5 and the integrated circuit chips 2-4. The bonding agent 14 such as solder is supplied beforehand to the metallized portions 7b formed on the chip surface arranging plate 7 for joining. At this time, in order to apply the load to the peripheral edge portion of the chip surface arranging plate 7, a loading tool 15 is disposed beforehand on the chip surface arranging plate 7.

In FIG. 5, since the circuit board 5 is warped, the upper surfaces of the integrated circuit chips 2-4 are not uniform in height and, hence, the distances between these upper surfaces and the chip surface arranging plate 7 are differed from each other. Namely, the distance from the chip surface arranging plate 7 becomes longer in the order of the integrated circuit chips 4, 2 and 3.

Since it is impossible for the cooling system 6 shown in FIG. 1 to provide a sufficient cooling effect so far as the integrated circuit chips 2-4 are not uniform in height as described above, in the semiconductor integrated circuit device with cooling system according to this embodiment, the chip surface arranging plate 7 is employed to make the integrated circuit chips 2-4 uniform in height.

Figure 6:
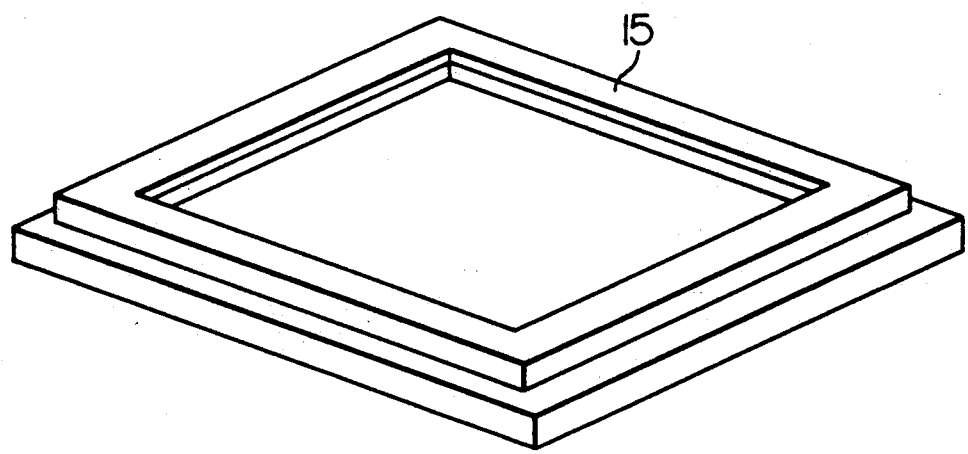
FIG. 6 is a perspective view of an example of a structure of a loading tool used in a step of joining the chip surface arranging plate to the semiconductor integrated circuit device.

FIG. 6 is a perspective view for illustrating an example of structure of the loading tool shown in FIG. 5.

The loading tool 15 is formed in the shape of a picture frame and has a structure that the upper surfaces of the integrated circuit chips 2-4 can be seen through the apertures of the chip surface arranging plate 7 as shown in FIG. 5. This loading tool 15 has a weight large enough to press the chip surface arranging plate 7a on the upper surfaces of the integrated circuit chips 2-4 and to make the bonding agent 14 uniform in thickness at a joining step.

Figure 7:
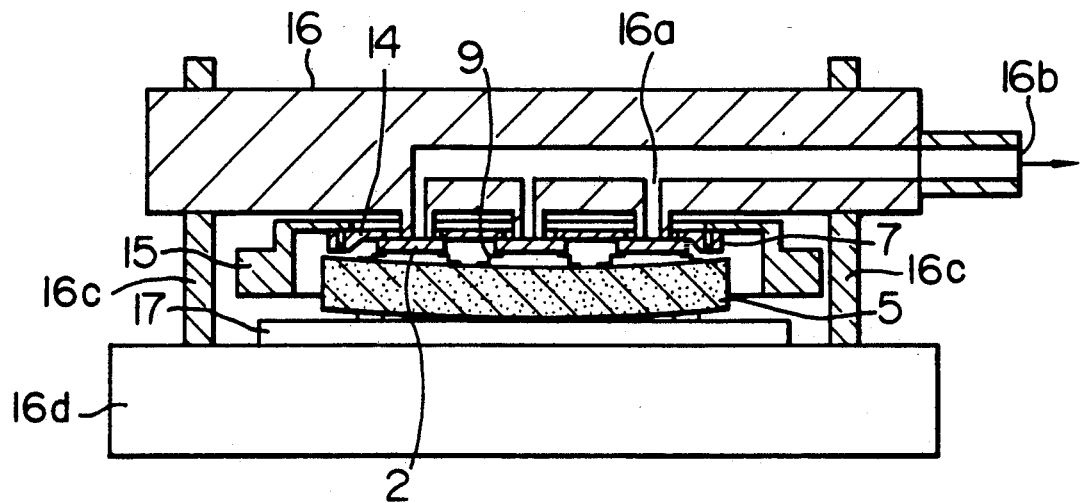
FIG. 7 is a side sectional view for illustrating an example of the step of joining the chip surface arranging plate to the integrated circuit chips of the semiconductor integrated circuit device shown in FIG. 1.

FIG. 7 is a side sectional view for illustrating the step of joining the integrated circuit chips 2-4 to the chip surface arranging plate 7.

At this step, the semiconductor integrated circuit device on which the chip surface arranging plate 7 and the loading tool 15 are put as shown in FIG. 5, is put on a heater 17, and further on that semiconductor integrated circuit device is put an absorbing or sucking tool 16 having a plurality of suction ports 16a and a suction port 16b to be connected to a vacuum pump or the like which is not shown. The absorbing tool 16 is supported by props 16c which are arranged on an absorbing tool base 16d. Under these conditions, the integrated circuit chips 2-4 are made to be uniform in height in the following way.

First, the absorbing tool 16 is disposed above the loading tool 15. Then, as absorbing or sucking through the suction port 16b by means of the vacuum pump or the like, the integrated circuit chips 2-4 are brought into close contact with the suction ports 16a with the lead wires 9 being deformed. Since the suction ports 16a are formed in one plane, the upper surfaces of the integrated circuit chips 2-4 are made to be flush with each other. At this time, the thus assembled apparatus is heated as a whole by the heater 17 so that the bonding agent 14 supplied to the chip surface arranging plate 7 is melted. It is noted that the assembled apparatus should be heated as a whole to an extent that the bonding agent 14 is melted satisfactorily but that the bonding agent used to connect the lead wires 9 to the circuit board 5 is not melted. Since the peripheral edge portion of the chip surface arranging plate 7 is applied with a load by the loading tool 15, the chip surface arranging plate 7 is pressed against the upper surfaces of the integrated circuit chips 2-4 sufficiently to thereby make the thickness of the bonding agent 14 at the joints uniform. Thereafter, heating by the heater 17 is stopped to cool the bonding agent 14 for fixing.

Since the joint surfaces of the chip surface arranging plate 7 are all formed in one plane, the upper surfaces of the integrated circuit chips 2-4 can be made flush with each other notwithstanding the circuit board 5 is warped for example.

Figure 8:
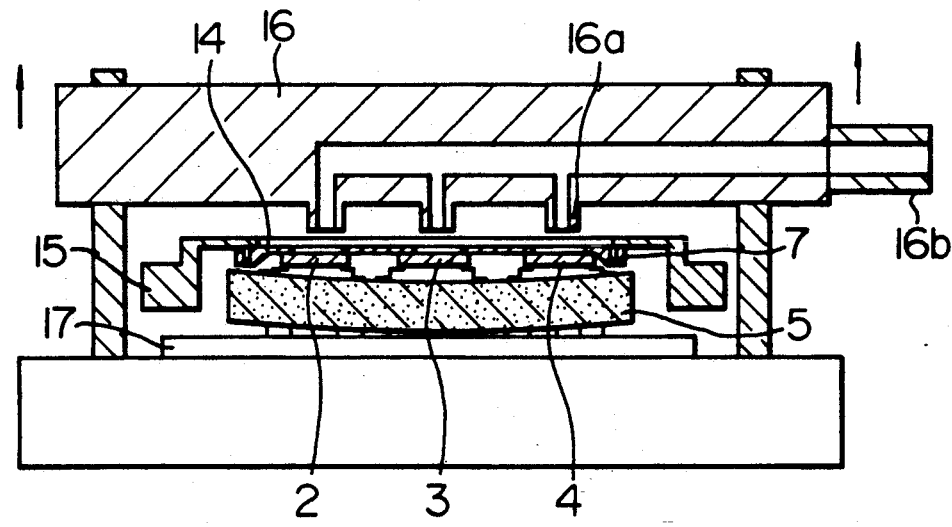
FIG. 8 is a side sectional view for illustrating a state of the semiconductor integrated circuit device shown in FIG. 1 after the completion of the step of joining the chip surface arranging plate to the integrated circuit chips.

FIG. 8 is a side sectional view for illustrating a state after the completion of the step of joining the integrated circuit chips to the chip surface arranging plate.

After the bonding agent 14 is cooled and the integrated circuit chips 2-4 and the chip surface arranging plate 7 are fixed to each other sufficiently, suction by the vacuum pump or the like is stopped to raise the absorbing tool 16 in the arrow mark direction, thereby separating the suction ports 16a from the integrated circuit chips 2-4. At this time, the integrated circuit chips 2-4 and the chip surface arranging plate 7 are fixed to each other so that the upper surfaces of the integrated circuit chips 2-4 can be kept uniform in height.

Figure 9:
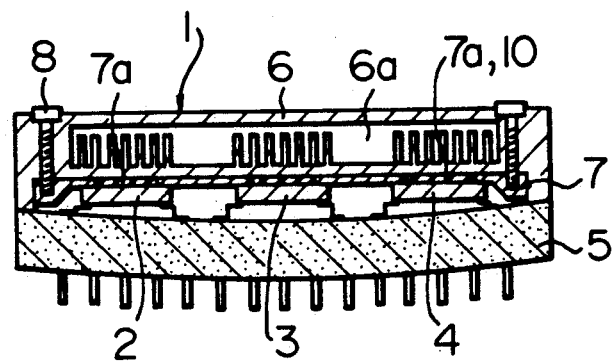
FIG. 9 is a side sectional view for illustrating an example of the step of fixing the cooling system to the semiconductor integrated circuit device shown in FIG. 1.

FIG. 9 illustrates the construction of the semiconductor integrated circuit device with cooling system at the final step of the manufacturing process thereof, according to this embodiment of the present invention which has been described in conjunction with FIGS. 4-8. At this step, the cooling system 6 is mounted on the semiconductor integrated circuit device equipped with the chip surface arranging plate 7 from which the absorbing tool 16 and the heater 17 shown in FIG. 8 have been removed, and then the chip surface arranging plate 7 and the cooling system 6 are fixed to each other.

More specifically, the apertures 7a of the chip surface arranging plate 7 are filled up with the thermally conductive compound 10 in the first place. Thereafter, the chip surface arranging plate 7 and the cooling system 6 are fixed to each other by means of screws 8, thereby completing the assembly of the semiconductor integrated circuit device with a cooling system 1.

In the thus-assembled semiconductor integrated circuit device with cooling system 1, heat generated from the integrated circuit chips 2-4 conducts through the thermally conductive compound 10 to the cooling system 6 so as to be removed to the outside by the coolant flowing through the flow passage 6a in the cooling system 6. Further, the lead to be applied to the integrated circuit chips 2-4 can be reduced, and therefore, the reliability of connection can be improved.

Although description has been made hereinabove as to the semiconductor integrated circuit device with cooling system according to an embodiment of the present invention, the present invention is not limited to the above-described construction but applicable to other constructions as described below.

Figure 10:
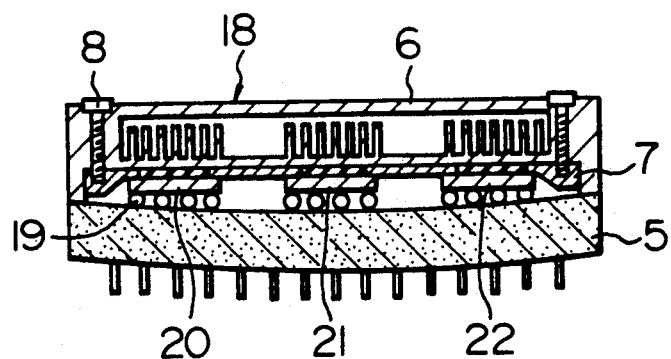
FIG. 10 is a side sectional view, for illustrating the construction, of a semiconductor integrated circuit device with cooling system according to another embodiment of the present invention.

FIG. 10 is a side sectional view for illustrating the construction of a semiconductor integrated circuit device with cooling system according to a second embodiment of the present invention.

In a semiconductor integrated circuit device with cooling system 18 according to this embodiment, the lead wires 9 used in the semiconductor integrated circuit device with cooling system 1 shown in FIG. 1 are substituted by solder bumps 19 by which integrated circuit chips 20-22 are electrically connected to the circuit board 5. Other component parts are the same as those of the semiconductor integrated circuit device with cooling system 1 shown in FIG. 1.

Even in the semiconductor integrated circuit device in which the integrated circuit chips 20-22 are mounted on the circuit board 5 by means of the solder bumps 19 as described above, it is possible to set the cooling system 6 easily and with high reliability by making use of the manufacturing method of the present invention.

Description will be given below of the step of joining the chip surface arranging plate 7 to the integrated circuit chips 20-22 according to the present embodiment.

Figure 11:
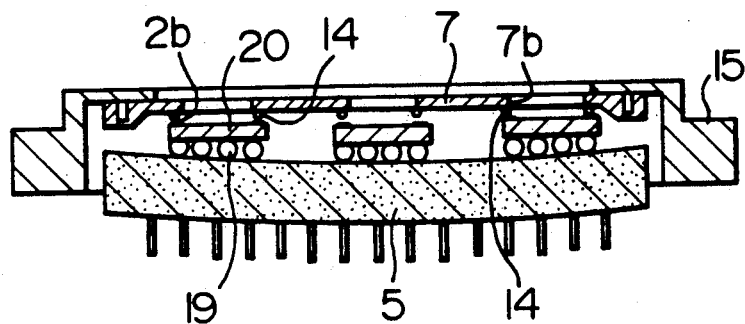
FIG. 11 is a side sectional view for illustrating a state of the semiconductor integrated circuit device with cooling system shown in FIG. 10 prior to the step of joining the chip surface arranging plate.

FIG. 11 is a side sectional view for illustrating the semiconductor integrated circuit device with cooling system shown in FIG. 10 in a state before the integrated circuit chips and the chip surface arranging plate are joined to each other. The chip surface arranging plate 7 and the loading tool 15 are disposed on the semiconductor integrated circuit device which comprises the circuit board 5 and the integrated circuit chips 20-22 mounted on and connected, by means of the solder bumps 19, to the circuit board 5. The metallized portion 2b is formed on each of the integrated circuit chips 20-22. On the other hand, the chip surface arranging plate 7 is formed with metallized portions 7b to which the bonding agent 14 such as solder is supplied beforehand. In this state, the upper surfaces of the integrated circuit chips 20-22 are not uniform in height since the circuit board 5 is warped.

Figure 12:
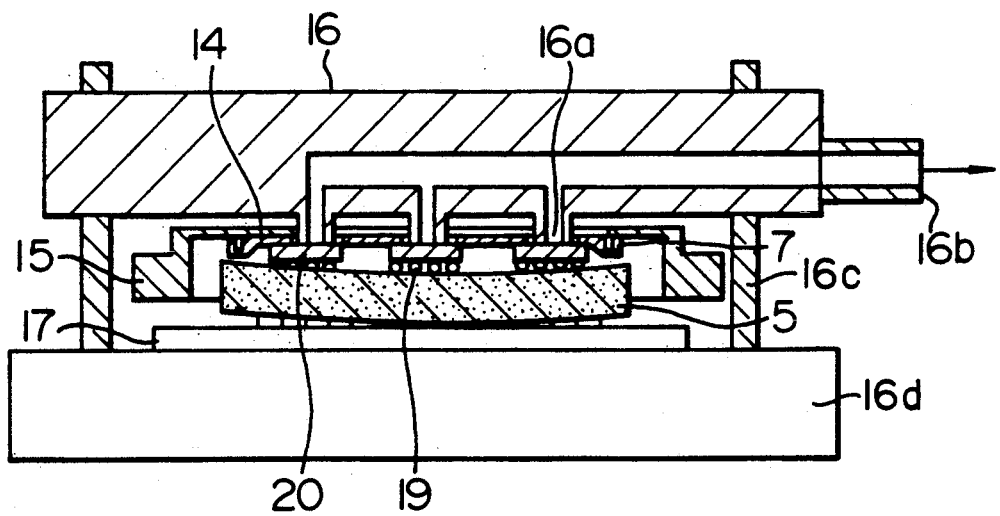
FIG. 12 is a side sectional view for illustrating an example of the step of joining the chip surface arranging plate to the integrated circuit chips of the semiconductor integrated circuit device shown in FIG. 10.

FIG. 12 is a side sectional view for illustrating the step of joining the integrated circuit chips to the chip surface arranging plate in the semiconductor integrated circuit device of this embodiment. FIG. 12 illustrates the step of making uniform the heights of the integrated circuit chips 20-22 of the semiconductor integrated circuit device shown in FIG. 11 on which the chip surface arranging plate 7 and the loading tool 15 are placed, by making use of the absorbing tool 16 and the heater 17 similarly to the first embodiment shown in FIG. 7.

In the first place, the absorbing tool 16 is disposed above the loading tool 15, and the solder bumps 19 are melted by being heated by the heater 17. In this state, as absorbing or sucking through the suction port 16b by means of the vacuum pump or the like, the melted solder bumps 19 serve to automatically adjust the heights in accordance with the warp of the circuit board 5 due to the surface tension thereof while keeping the connections, so that the integrated circuit chips 20-22 are brought into close contact with the suction ports 16a. As a result, the upper surfaces of the integrated circuit chips 20-22 are made flush with each other.

The temperature of the heater 17 is further raised to melt the bonding agent 14 of the joint solder or the like. Since the peripheral edge portion of the chip surface arranging plate 7 is applied with load by the loading tool 15, the integrated circuit chips 20-22 and the chip surface arranging plate 7 are made in close contact with each other. Thereafter, heating by the heater 17 is stopped to cool the bonding agent 14 and the solder bumps 19, thereby fixing the integrated circuit chips 20-22 and the chip surface arranging plate 7 to each other.

Thereafter, in the same way as the first embodiment, the cooling system 6 is fixed on the chip surface arranging plate 7 by means of the screws 8, thereby completing the assembly of the semiconductor integrated circuit device 18 as shown in FIG. 10.

In this embodiment, since the adjustment of height of the integrated circuit chips 20-22 is performed in a state that the solder bumps 19 are molten, no substantial load is applied to the solder bumps 19. Accordingly, as compared with the case of the first embodiment in which the lead wires 19 are used as shown in FIG. 1, the life of connection can be improved. Further, by forming the solder bumps 19 of a solder the melting point of which is lower than that of the bonding agent 14 for connecting the integrated circuit chips 2-4 to the chip surface arranging plate 7, only the solder bumps 19 can be melted and solidified after the integrated circuit chips 20-22 and the chip surface arranging plate 7 have been fixed to each other, thereby making it possible to minimize the irregularity or variation in shape of the solder bumps 19.

As described above, in the semiconductor integrated circuit device with cooling system according to this embodiment, the chip surface arranging plate is used for making all the integrated circuit chips on the circuit board uniform in height. This makes it possible to simplify the structure of the cooling system, resulting in that mounting and replacement of the cooling system can be facilitated as well.

Further, since the chip surface arranging plate and the integrated circuit chips are joined by making use of the absorbing or suction force, it is possible to join all the integrated circuit chips to the chip surface arranging plate reliably without being affected by the warp of the circuit board, resulting in reliable conduction of heat from the integrated circuit chips to the cooling system.

In addition, since the absorbing or attracting force used in joining the chip surface arranging plate to the integrated circuit chips becomes unnecessary after the joining, the integrated circuit chips and the lead wires are freed from the load, thereby making it possible to avoid the damage to the integrated circuit chips and defective wiring.

Incidentally, the present invention is not limited to the above-described embodiments, and the aperture may be formed in the shape of a circle and the thermally conductive compound may be substituted by low-melting-point solder. For example, if Pb40-Sn60 wt % solder is used, due to its heat conductivity (507 W/m·K) which is greater than that of the thermally conductive compound, even an integrated circuit chip of higher power dissipation can be cooled down. Further, the circuit board, chip surface arranging plate and cooling system may be made of a material identical with that of the integrated circuit chip such as Si substrate, for example. In this case, since the distortion under thermal expansion is identical between the members, there is caused no distortion under heat with respect to the lead wires and solder bumps, thereby making it possible to further improve the reliability of connection.

As has been described in the foregoing, since the chip surface arranging plate is used for making all the integrated circuit chips on the circuit board uniform in height, it is possible to actualize a cooling system which is simple in construction, easy to mount and capable of achieving a high efficiency, resulting in that miniaturization and mass production of the semiconductor integrated circuit device with cooling system of high cooling efficiency becomes possible. Further, the integrated circuit chips and lead wires can be freed from the load, thereby making it possible to improve the reliability of the semiconductor integrated circuit device with cooling system.

We claim:

1. A semiconductor integrated circuit device with a cooling system, comprising:
   a circuit board;
   a plurality of integrated circuit chips mounted on the circuit board;
   the cooling system serving to cool the plurality of integrated circuit chips, one plane surface of the cooling system being kept in thermal contact with upper surfaces of said plurality of integrated circuit chips; and
   a chip surface arranging plate disposed on upper surfaces of said integrated circuit chips, the chip surface arranging plate being uniform in thickness and having apertures formed therethrough at positions respectively corresponding to said integrated circuit chips, a size of each of the apertures being smaller than that of the corresponding one of said integrated circuit chips,
   said plurality of integrated circuit chips being joined to a lower surface of said chip surface arranging plate after being drawn to the lower surface of the plate by applying a vacuum causing suction of air through said apertures, and
   said cooling system being in thermal contact with an upper surface of said chip surface arranging plate.

2. A semiconductor integrated circuit device with a cooling system according to claim 1, further comprising a heat conductor filled in the apertures of said chip surface arranging plate after said plate has been joined to said integrated circuit chips, each said heat conductor being in thermal contact with said cooling system.

3. A semiconductor integrated circuit device with a cooling system according to claim 1, further comprising flexible wire members, each provided for electrically connecting each of said plurality of integrated circuit chips with said circuit board and for keeping the upper surface of each said chip in contact with the lower surface of said plate.

4. A semiconductor integrated circuit device with a cooling system according to claim 1, further comprising solder bumps provided between each of said integrated circuit chips and said circuit board for maintaining electric connection therebetween, each of said solder bumps for each said chip having a height required to keep the upper surface of said each chip in contact with the lower surface of said plate.

5. A semiconductor integrated circuit device with a cooling system according to claim 1, wherein said integrated circuit chips are each fixed to said chip surface arranging plate at a peripheral edge portion of each of said apertures by means of a bonding agent.

6. A semiconductor integrated circuit device with a cooling system according to claim 5, wherein said bonding agent comprises a solder.

7. A semiconductor integrated circuit device with a cooling system according to claim 6, wherein said integrated circuit chips are connected to said circuit board by means of flexible wire members of small rigidity.

8. A semiconductor integrated circuit device with a cooling system according to claim 7, wherein said wire members are connected to said circuit board by means of solder having a melting point higher than that of the solder for joining said integrated circuit chips to said chip surface arranging plate.

9. A semiconductor integrated circuit device with a cooling system according to claim 6, wherein said integrated circuit chips are connected to said circuit board by means of solder bumps.

10. A semiconductor integrated circuit device with a cooling system according to claim 9, wherein said solder bumps are made of a solder having a melting point lower than that of the solder for joining said integrated circuit chips to said chip surface arranging plate.

11. A semiconductor integrated circuit device with a cooling system according to claim 1, wherein said integrated circuit chips are sealed in a space defined by said circuit board and said cooling system.

12. A method for producing a semiconductor integrated device which has a circuit board, a plurality of integrated circuit chips mounted on the circuit board, and a cooling system which serves to cool the plurality of integrated circuit chips with one plane surface thereof kept in thermal contact with upper surfaces of said plurality of integrated circuit chips, said method comprising the steps of:
   placing a chip surface arranging plate on the upper surfaces of said chips, the plate being uniform in thickness and having apertures formed therethrough, a size of each of the apertures being smaller than that of a corresponding one of said plurality of integrated circuit chips;
   drawing said chips toward said plate by applying a vacuum to cause suction of air through the apertures;
   joining said plurality of integrated circuit chips to a lower surface of said chip surface arranging plate after the vacuum applying; and
   establishing thermal contact between said cooling system and said chip surface arranging plate.

13. A method for producing a semiconductor integrated circuit device according to claim 12, wherein said step of drawing said plurality of integrated circuit chips to said plate by suction of air through the apertures in said chip surface arranging plate draws said plurality of integrated circuit chips to said chip surface arranging plate substantially simultaneously.

* * * * *